United States Patent
Wacker

(10) Patent No.: US 6,168,003 B1
(45) Date of Patent: Jan. 2, 2001

(54) METHOD AND APPARATUS FOR THE LINEAR POSITIONING AND FOR THE POSITION RECOGNITION OF A SUBSTRATE ON AN ONSERTING UNIT

(75) Inventor: Josef Wacker, Berg (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/192,375

(22) Filed: Nov. 16, 1998

(30) Foreign Application Priority Data

May 28, 1998 (DE) .............................................. 198 23 938

(51) Int. Cl.[7] ............................ B65G 43/00; B65G 15/64
(52) U.S. Cl. .................................. 198/341.01; 198/345.1; 198/810.01
(58) Field of Search ........................ 198/341.01, 345.1, 198/810.01

(56) References Cited

U.S. PATENT DOCUMENTS 4,463,845 * 8/1984 Harris ................................. 198/345.1
4,643,415    2/1987 Kuehnert .

FOREIGN PATENT DOCUMENTS

| 36 30 178 A1 | 3/1988 | (DE) . |
| 43 25 565 A1 | 2/1994 | (DE) . |
| 43 25 565 C2 | 2/1994 | (DE) . |
| 197 38 922 A1 | 11/1998 | (DE) . |
| 0 257 553 A2 | 3/1988 | (EP) . |
| 0 826 612 A1 | 3/1998 | (EP) . |
| 2 150 098 | 6/1985 | (GB) . |

* cited by examiner

Primary Examiner—Robert P. Olszewski
Assistant Examiner—Bryan Jaketic
(74) Attorney, Agent, or Firm—Schiff Hardin & Waite

(57) ABSTRACT

An apparatus for the linear positioning and for the position recognition of a substrate, comprising a linear transport for conveying the substrate, a sensor whose sensor field is set to a freely selectable braking position along the conveying path of a substrate feature of the substrate, and a controller connected to the linear transport and to the sensor for decelerating and stopping the linear transport, so that the substrate feature comes to rest in an onserting position.

14 Claims, 2 Drawing Sheets

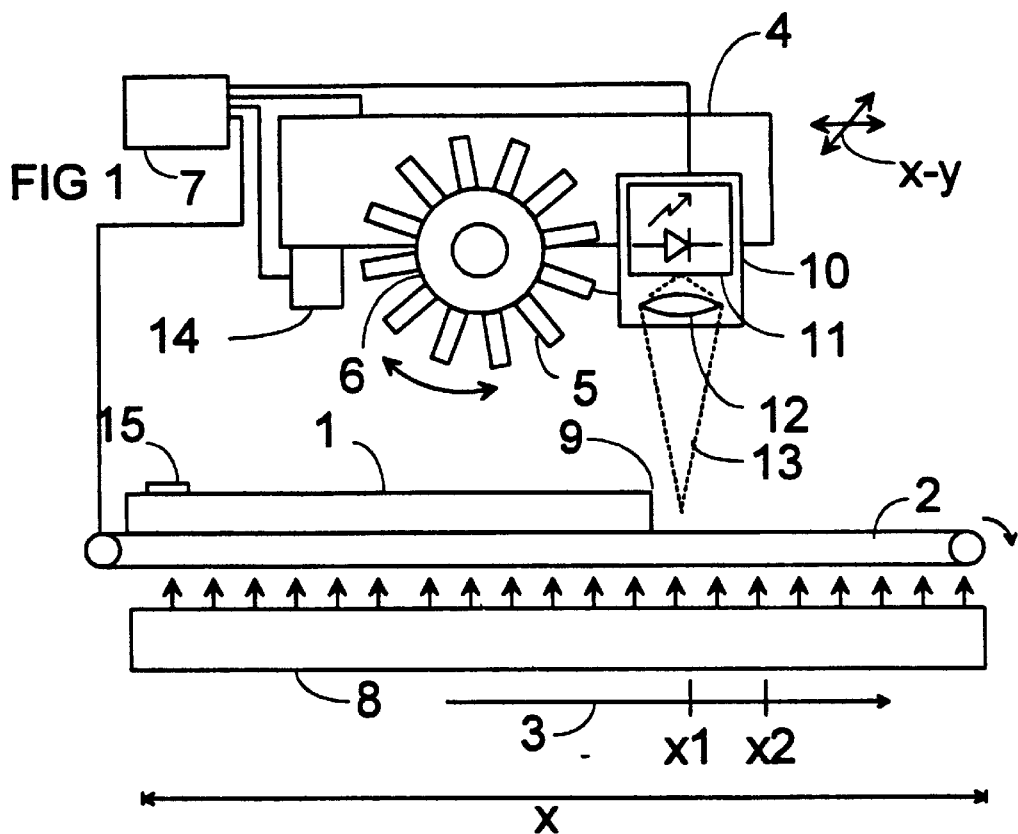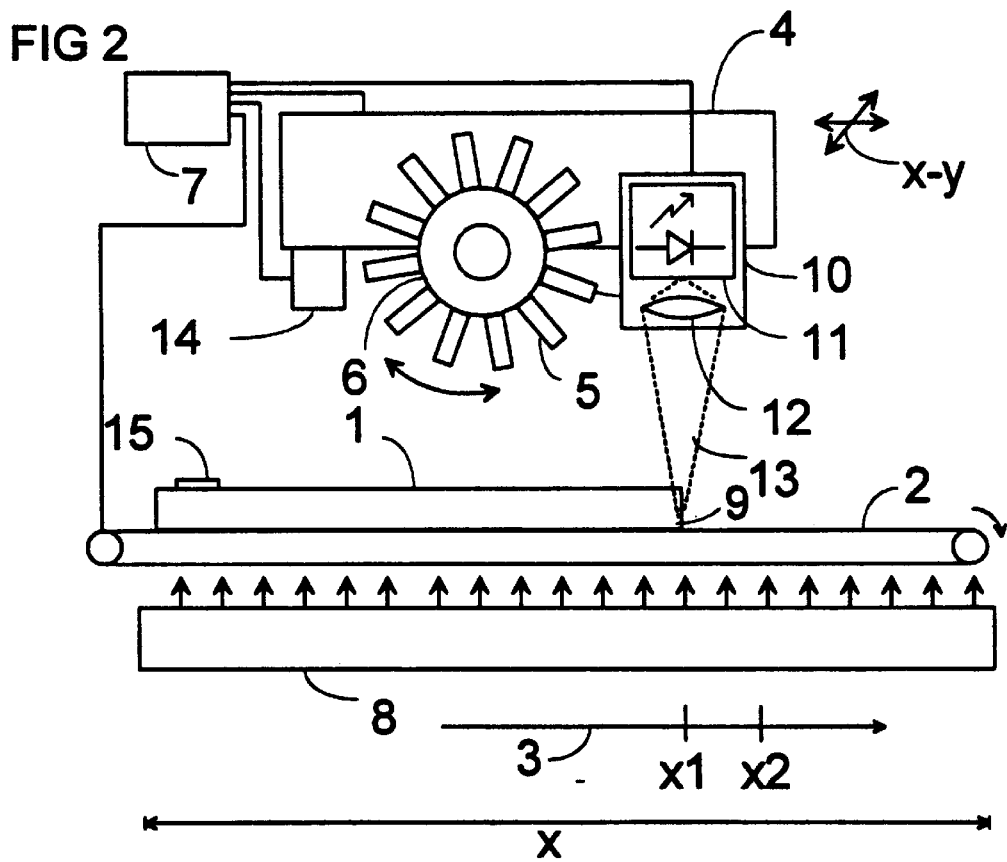

METHOD AND APPARATUS FOR THE LINEAR POSITIONING AND FOR THE POSITION RECOGNITION OF A SUBSTRATE ON AN ONSERTING UNIT

BACKGROUND OF THE INVENTION

The invention is directed to a method for linear positioning and for position recognition of a substrate within an onserting field of an automatic onserting unit and is also directed to an apparatus for the implementation of the method.

In the automatic equipping of substrates (for example, printed circuit boards or ceramic substrates) with components (for example, SMD components) (SMD=surface mounted device) or (Ball-Grad Arrays=BGA), the individual components are taken from a magazine or a delivery means with an onserting head and are then positioned on the substrate in a predetermined position. The substrates are also taken from a magazine, guided at two opposite sides and conveyed into the automatic onserting unit with the assistance of a linear transport. For precise onserting or equipping, it is required that the position of the printed circuit board along its conveying path be exactly known.

Ultrasound reflex sensors that recognize a conveyed printed circuit board have been used for the recognition of printed circuit boards. The linear transport is decelerated in response sensing of the substrate and the substrate is moved at low speed against an introduceable, mechanical stopper. Reflected light sensors are sometimes also employed instead of the ultrasound reflex sensor. Different circuit boards or ceramic substrates exhibit different transparencies for the light employed and, thus, exhibit different reflection properties.

EP 0 257 553, incorporated herein by reference, discloses an onserting unit with such sensors.

However, ultrasound reflex sensors, or, respectively, reflected light sensors are not suitable for all substrates. Over and above this, it is disadvantageous for all substrates to be moved against a permanently positioned mechanical stopper in this method, so that the onserting head must, in part, travel longer transport paths than would be necessary, given small substrates, for example, depending upon the position of the delivery devices. Moreover, the substrates can experience an acceleration given the abrupt deceleration by the mechanical stopper that can lead to sliding by components already put into place.

SUMMARY OF THE INVENTION

It is an object of the invention to provide a method and an apparatus for the implementation of the method for positioning substrates independently of their material and their spatial expanse in an automatic onserting unit such that optimally short travel paths with the equipping are obtained.

To this end in an embodiment, the invention provides a method for the linear positioning and for the position recognition of a substrate within an onserting field of an automatic onserting unit with a linear transport, comprising the steps of: directing a sensor field onto the substrate at a braking position along the conveying path of a substrate feature of the substrate within the equipping field; decelerating the linear transport after the substrate feature has passed through the braking position in a preselected way until it approximately achieves an onserting position; after the deceleration of the linear transport, setting the sensor field approximately to the onserting position of the substrate feature of the stopped substrate; and identifying the onserting position of the resting substrate feature for position recognition.

In an embodiment, the invention provides an apparatus for the linear positioning and for the position recognition of a substrate, comprising a linear transport for conveying the substrate, a sensor whose sensor field is set to a freely selectable braking position along the conveying path of a substrate feature of the substrate, and a control means connected to the linear transport and to the sensor for decelerating and stopping the linear transport, so that the substrate feature comes to rest in an onserting position.

In accordance with aspects of the invention, the position of a substrate in the entire onserting field can be determined by employing a sensor having a sensor field that essentially covers the onserting field of the automatic onserting unit. The sensor is first arranged such that a substrate conveyed into the onserting field is recognized by the sensor at a braking position. A predetermined substrate feature, for example the leading edge of the substrate, a bar code applied at a predetermined location of the substrate or terminals arranged on the substrate or other opaque locations of the substrate serve the purpose of recognition. The linear transport is decelerated after the sensor has recognized the substrate material, so that the substrate comes to rest at an onserting position. The sensor detects the position of a substrate feature at the equipping position, so that the position of the substrate is known.

According to an aspect of the invention, the position identification of the substrate feature at the onserting position is advantageously utilized to move an optical adjustment sensor into the region of adjustment marks applied on the substrate for an even more exact position identification.

To that end, in an embodiment, the invention provides a method for the linear positioning and for position recognition of a substrate, characterized in that an optical adjustment sensor is moved into the region of adjustment marks on the basis of the position data of the resting substrate feature.

According to another aspect of the invention, the front edge of the substrate is recognized as substrate material.

To that end, in an embodiment, the invention provides a method for the linear positioning and for the position recognition of a substrate, characterized in that the front edge of the substrate is acquired by the sensor as the substrate feature Different substrate features, like the front edge or a bar code can be recognized in a simple way by employing an optical sensor.

To that end, in an embodiment, the invention provides that the sensor is an optical sensor.

According to a preferred aspect of the invention, the sensor is rigidly connected to an onserting head moveable above the substrate, so that the sensor and, thus, the sensor field can be adjusted in a simple way to the freely selectable braking position of the transport path.

To that end, in an embodiment, the invention provides that the sensor is rigidly connected to an onserting head of the automatic onserting unit moveable above the substrate An especially advantageous aspect of the invention provides that the adjustment sensor normally arranged at the onserting head for the recognition of adjustment marks serves as a sensor for recognizing the substrate features, the cost for an additional sensor being eliminated as a result thereof.

To that end, in an embodiment, the invention provides that the adjustment sensor arranged at the onserting head serves as a sensor for the recognition of the substrate feature.

Finally, a simple optical sensor for the recognition of substrate features can be advantageously employed at the onserting head by providing an upwardly directed light source.

These and other features of the invention are discussed in greater detail below in the following detailed description of the presently preferred embodiments with reference to the accompanying drawings.

BRIEF DESCRIPTION OF THE DRAWINGS

FIG. 1 illustrates a schematic side view of an automatic onserting unit with a substrate that is moved into the automatic onserting unit;

FIG. 2 illustrates a schematic side view of an automatic onserting unit, whereby a substrate feature of the printed circuit board is detected at a braking position.

DETAILED DESCRIPTION OF THE PRESENTLY PREFERRED EMBODIMENTS

Figure 3:
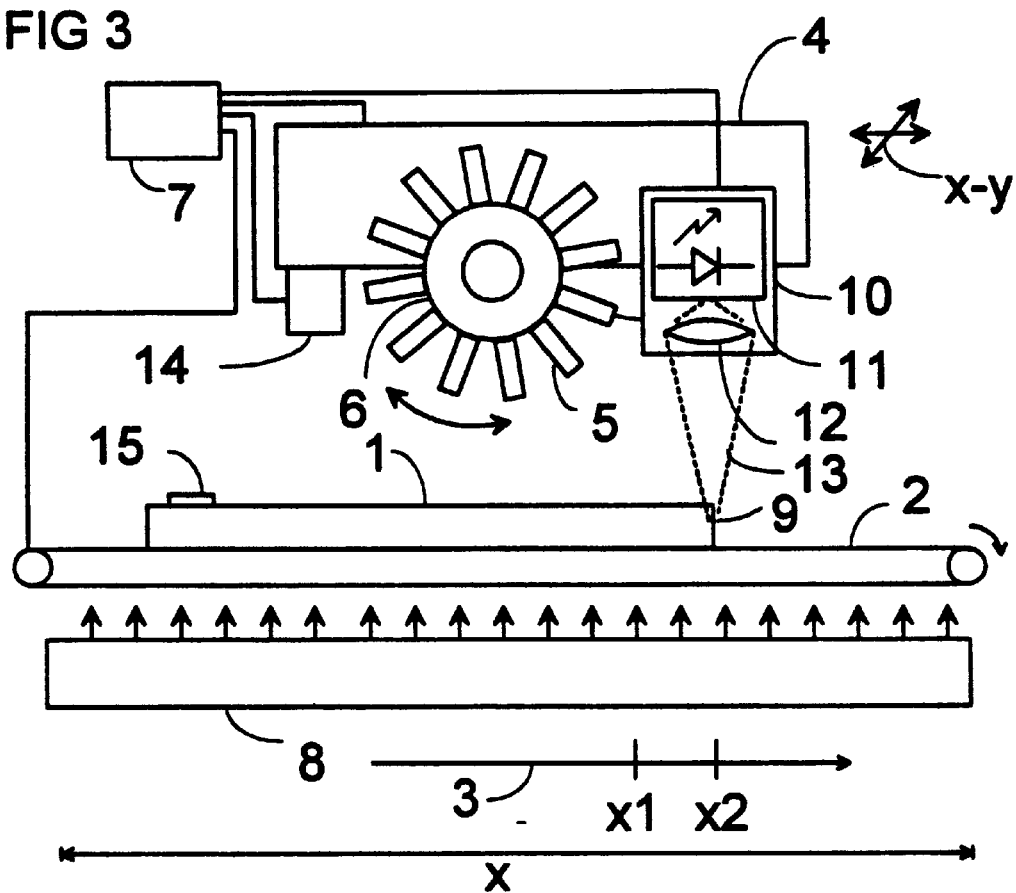
FIG. 3 illustrates a schematic side view of an automatic onserting unit, whereby a decelerated substrate is more precisely measured at an onserting position.

FIG. 1 shows how a substrate 1 (for example, a printed circuit board or a ceramic substrate) is moved into an automatic onserting unit in a conveying direction 3 on a linear transport 2. The onserting region of the automatic onserting unit is referenced X.

In this embodiment, a fastening means 6 with a plurality of suction pipettes 5, a sensor 10 and an adjustment sensor 14 are secured to an onserting head 4 moveable in XY-directions. The suction pipettes 5 serve for picking up components (not shown) from delivery units (not shown) and serve the purpose of positioning these components on the substrate 1. The linear transport 2, the adjustment sensor 14, the onserting head 4 as well as the sensor 10 are connected to a control means 7. The sensor 10 is configured as an optical sensor with the detector 11 and an optical imaging means 12 that generates a sensor field that is positioned at a freely selectable braking position X1. A stationary light source 8, for example, a white light source that preferably extends over the entire equipping region X, is attached under the linear transport 2 and illuminates the substrate 1 from below. Light sources having a mainly linear expanse as well as partially planarly designed light sources can thereby be utilized in order, for example, to recognize substrates with clearances (or recesses). Adjustment marks 15 are provided on the substrate 1 for the exact positioning of the substrate.

FIG. 2 illustrates how the front edge 9 of the substrate 1 is recognized by the sensor 10 as a substrate feature at the braking position X1. The linear transport 2 is decelerated via the control means 7, so that the substrate with the substrate feature 9 is stopped at an equipping position x2, as shown in FIG. 3. For the exact investigation of the equipping position x2, the sensor 10 is moved with its sensor field 13 to the onserting position x2 with the assistance of the onserting head 4 moveable in XY-directions. The sensor 10 then is used to measure the exact position of the substrate 1.

As a result of the position measurement, the position of the adjustment marks 15 of the substrate 1 can be calculated, so that the adjustment sensor 14 can be moved over the adjustment marks 15, as a result whereof a high-precision position identification of the substrate 1 ensues. As a result of the exact position identification of the substrate 1, the substrate 1 can now be equipped with components in highly exact fashion. Due to the lateral guidance of the substrates 1 in automatic onserting units, the exact position recognition in the conveying direction 3 suffices for the position [or: attitude] recognition.

Depending upon the size of the substrate, the position of the substrate 1 on short onserting paths can be optimized with this method, so that short onserting times and, thus, high onserting performances are achieved.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for the linear positioning and for the position recognition of a substrate within an onserting field of an automatic onserting unit with a linear transport, comprising the steps of:

directing a sensor field onto the substrate at a braking position along the conveying path of a substrate feature of the substrate within the onserting field;

decelerating the linear transport after the substrate feature has passed through the braking position in a preselected way until it approximately achieves an onserting position;

after the deceleration of the linear transport, setting the sensor field approximately to the onserting position of the substrate feature of the stopped substrate; and identifying the onserting position of the resting substrate feature for position recognition.

2. The method for the linear positioning and for position recognition of a substrate according to claim 1, comprising the step of moving an optical adjustment sensor into the region of adjustment marks on the basis of the position data of the resting substrate feature.

3. The method for the linear positioning and for the position recognition of a substrate according to claim 1 or claim 2, comprising the step of acquiring the front edge of the substrate as the substrate feature with the sensor.

4. An apparatus for the linear positioning and for the position recognition of substrate in an onserting unit, comprising:

a linear transport for conveying the substrate along a conveying path;

a sensor whose sensor field is set to a freely selectable braking position along the conveying path of a substrate feature of the substrate; and a control means connected to the linear transport and to the sensor for decelerating and stopping the linear transport, so that the substrate feature comes to rest at an onserting position.

5. The apparatus according to claim 4, wherein the sensor is an optical sensor.

6. The apparatus according to claim 4 or claim 5, wherein the sensor is rigidly connected to an onserting head of the automatic onserting unit moveable above the substrate.

7. The apparatus according to claim 4, wherein an adjustment sensor at an onserting head serves as a sensor for the recognition of the substrate feature.

8. The apparatus according to claim 5, wherein an adjustment sensor arranged at an onserting head serves as a sensor for the recognition of the substrate feature.

9. The apparatus according to claim 6, wherein an adjustment sensor arranged at the onserting head serves as a sensor for the recognition of the substrate feature.

10. The apparatus according to claim 4, further comprising an upwardly directed light source stationarily arranged under the substrate to illuminate the entire freely selectable positioning region of the substrate features of different substrates.

11. The apparatus according to claim 5, comprising an upwardly directed light source stationarily arranged under the substrate to illuminate the entire freely selectable positioning region of the substrate features of different substrates.

12. The apparatus according to claim 6, comprising an upwardly directed light source stationarily arranged under the substrate to illuminate the entire freely selectable positioning region of the substrate features of different substrates.

13. The apparatus according to claim 7, comprising an upwardly directed light source stationarily arranged under the substrate to illuminate the entire freely selectable positioning region of the substrate features of different substrates.

14. The apparatus according to claim 9, comprising an upwardly directed light source stationarily arranged under the substrate to illuminate the entire freely selectable positioning region of the substrate features of different substrates.

* * * * *